US009071198B2

(12) United States Patent
 Svechtarov

(10) Patent No.: US 9,071,198 B2
(45) Date of Patent: Jun. 30, 2015

(54) AMPLIFIER CIRCUIT

(71) Applicant: NXP B.V., Eindhoven (NL)

(72) Inventor: Iordan Konstantinov Svechtarov, Wijchen (NL)

(73) Assignee: NXP, B.V., Eindhoven (NL)

( * ) Notice: Subject to any disclaimer, the term of this patent is extended or adjusted under 35 U.S.C. 154(b) by 148 days.

(21) Appl. No.: 13/887,182

(22) Filed: May 3, 2013

(65) Prior Publication Data
 US 2014/0145791 A1     May 29, 2014

(30) Foreign Application Priority Data
 May 17, 2012 (EP) ..................................... 12168446

(51) Int. Cl.
| H03F 3/68 | (2006.01) |
| H03F 1/02 | (2006.01) |
| H03F 1/56 | (2006.01) |
| H03F 3/195 | (2006.01) |
| H03F 3/60 | (2006.01) |
| H03F 3/21 | (2006.01) |

(52) U.S. Cl.
 CPC .............. *H03F 1/0288* (2013.01); *H03F 1/56* (2013.01); *H03F 3/195* (2013.01); *H03F 3/604* (2013.01); *H03F 3/211* (2013.01)

(58) Field of Classification Search
 USPC ..................................... 330/124 R, 307, 295
 IPC ......................................................... H03F 3/68
 See application file for complete search history.

(56) References Cited

U.S. PATENT DOCUMENTS

| 8,358,172 | B2 | 1/2013 | Chujo et al. |
| 8,487,703 | B2 * | 7/2013 | Blednov ......................... 330/295 |
| 2002/0036541 | A1 | 3/2002 | Buer |
| 2004/0246055 | A1 | 12/2004 | Hardial et al. |
| 2005/0231286 | A1 | 10/2005 | Gotou et al. |
| 2011/0204980 | A1 | 8/2011 | Blednov |
| 2014/0022020 | A1 * | 1/2014 | Aaen et al. .................... 330/295 |

FOREIGN PATENT DOCUMENTS

| WO | 2006/003608 A1 | 1/2006 |
| WO | 2006/006119 A1 | 1/2006 |
| WO | 2007/122586 A2 | 11/2007 |
| WO | 2008/062371 A2 | 5/2008 |
| WO | 2011/055964 A2 | 5/2011 |

OTHER PUBLICATIONS

European Extended Search Report for Patent Appln No. 12168446.8 (Oct. 4, 2012).

* cited by examiner

*Primary Examiner* — Patricia T Nguyen

(57) ABSTRACT

An integrated Doherty amplifier circuit comprising a main input terminal, a peak input terminal and an output terminal, a main input conductor and a peak input conductor that are offset from one another in a first direction, the main and peak input conductors extend in a second direction that is perpendicular to the first direction, and wherein an input end of the main input conductor is coupled to the main input terminal and an input end of the peak input conductor is coupled to the peak input terminal, an output conductor that extends in the second direction, an output end of the output conductor is coupled to the output terminal, a main amplifier stage extends in the second direction and has a main stage input and a main stage output, a peak amplifier stage extends in the second direction and has a peak stage input and a peak stage output.

14 Claims, 6 Drawing Sheets

AMPLIFIER CIRCUIT

CROSS-REFERENCE TO RELATED APPLICATIONS

This application claims the priority under 35 U.S.C. §119 of European patent application no. 12168446.8, filed on May 17, 2012, the contents of which are incorporated by reference herein.

The present invention relates to amplifier circuits, in particular, although not exclusively to high power radio frequency amplifiers including Doherty amplifier circuits.

The use of load line modulation technique as a means to improve overall power amplifier (PA) efficiency has been around for some time.

Doherty type amplifiers are widely used for power amplifiers (PA) in wireless communications due to their high efficiency when handling variable power levels, which are common in multi-carrier wireless communications systems. Doherty amplifiers comprise a main amplifier and a peak amplifier. The main amplifier handles power levels up to a certain transition point and the peak amplifier operating at power levels above the transition point. Together, the main and peak amplifiers, which typically are different classes, can deliver an improved back-off power level efficiency compared with a similarly rated single stage AB- or A-class amplifier.

The listing or discussion of a prior-published document in this specification should not necessarily be taken as an acknowledgement that the document is part of the state of the art or is common general knowledge.

In accordance with an aspect of the invention there is provided an integrated Doherty amplifier circuit comprising:
 a main input terminal, a peak input terminal and an output terminal;
 a main input conductor and a peak input conductor that are offset from one another in a first direction, wherein the main and peak input conductors both extend in a second direction that is perpendicular to the first direction, and wherein an input end of the main input conductor is coupled to the main input terminal and an input end of the peak input conductor is coupled to the peak input terminal;
 an output conductor that extends in the second direction, wherein an output end of the output conductor is coupled to the output terminal;
 a main amplifier stage that extends in the second direction and has a main stage input and a main stage output;
 a peak amplifier stage that extends in the second direction and has a peak stage input and a peak stage output;
 a main input set of connections configured to couple the main stage input to the main input conductor;
 a main output set of connections configured to couple the main stage output to the output conductor;
 a peak input set of connections configured to couple the peak stage input to the peak input conductor; and
 a peak output set of connections configured to couple the peak stage output to the output conductor.

The arrangement of input conductors, amplifier stages and output conductor defined above can allow for a coherent signal to be provided to a number of transistor amplifiers within the main and peak amplifier stages, recombined in-phase. This in-phase recombination can allow for greater power output and higher efficiency whilst maintaining output signal coherence.

The terminals, conductors and amplifier stages may be provided on a on a ceramic or plastic package and or on dielectric substrate. The first and second directions may both be in the plane of the substrate. The dielectric substrate may be silicon or laminate.

The main amplifier stage may be a class A or AB amplifier. The peak amplifier stage may be a class B or C amplifier.

The transistors may be field effect transistors. The use of field effect transistors may, in applications such as mobile phone base stations, allow improved power efficiency compared to implementations employing bipolar transistors. The main stage input may comprise a gate connection of a field effect transistor, or transistors. The main stage output may comprise a drain connection of the field effect transistor, or transistors. The peak stage input may comprise a gate connection of a field effect transistor, or transistors. The peak stage output may comprise a drain connection of the field effect transistor, or transistors.

The main amplifier stage may comprise a plurality of main transistors. The provision of multiple transistors enables power scaling and improved performance for applications requiring an increased power output. The main transistors may be spaced apart in the second direction. The peak amplifier stage may comprise a plurality of peak transistors. The peak transistors may be spaced apart mutually displaced in the second direction. The main stage input may comprise the gate terminals of the respective main transistors. The main stage output may comprise the drain terminals of the respective main transistors. The peak stage input may comprise the gate terminals of the respective peak transistors. The peak stage output may comprise the drain terminals of the respective peak transistors.

The amplifier circuit may have an input side and an opposing output side that are displaced in the second direction. The input end of the peak input conductor and/or the input end of the main input conductor may be closer to the input side of the amplifier than the output side. The output end of the output conductor may be closer to the output side of the amplifier circuit than the input side.

The main stage input and main stage output may be on opposing edges of the main amplifier stage. The main stage input and main stage output may extend in the second direction. The peak stage input and peak stage output may be on opposing edges of the peak amplifier stage. The peak stage input and peak stage output may extend in the second direction. These arrangements may enable easier connectivity for the main and/or peak stage input and output and also provide a compact circuit layout A "set of connections" as defined herein may refer to a single connection. Further, the terms "connection" and "connections" may be used interchangeably. The plurality of connections within the main input, main output, peak input and peak output sets of connections may be spaced apart in the second direction. This may allow individual connections to be associated with individual or a subset of transistors in the main or peak amplifier stages.

The main output set of connections may indirectly couple the main stage output to the output conductor. The indirect coupling may be routed via the peak stage output and may include the peak output set of connections. Elements of this arrangement may alternatively be expressed as a direct connection between the main stage output and the peak stage output via the main output set of connections. This arrangement can lower the requirement for the phase shifting impedance provided by the main output set of connections and therefore enable a shorter connection to be used such that the main amplifier stage and peak amplifier stage can be located closer together.

The main output set of connections may be configured to provide a 90 degree phase shift to signals at an operational frequency of the amplifier. Alternatively, the main input set of connections may be configured to provide a positive odd integer multiple of 90 degrees. The multiple of 90 degrees may be 90 degrees. The multiple of 90 degrees may not be 0 degrees. Lowering the phase shift multiple has the effect of increasing the bandwidth of the amplifier at the operating frequency.

The circuit may further comprise one or more input capacitive elements. The input capacitor elements can provide input impedance matching to the amplifier stages. The input capacitive elements may be configured to couple the main stage input to the main input conductor. The input capacitive elements may be configured to couple the peak stage input to the peak input conductor. When discussing a capacitive element, the phrase "couple feature A to feature B" may mean that a plate of the capacitive element is galvanically coupled to both feature A and feature B, that is, that the connection is electrically between feature A and feature B.

It will be appreciated that the capacitive elements described herein each comprise two plates. Herein, reference to a connection or coupling to the capacitive element may mean a connection to a first plate of the capacitive element. The first plate of the element may be located on a first surface of the substrate. In such a case, the amplifier stages are also located on the first surface of the substrate. The corresponding second plate of the capacitive element can be found in a parallel plane. The parallel plane may be a reverse surface of the substrate. A second capacitive element may be galvanically coupled to ground. The second capacitive element may be galvanically coupled to ground via a conductive plate in direct contact with the reverse of the substrate.

The circuit may further comprise at least one additional capacitive element. The at least one additional capacitive element may be configured to provide capacitive coupling to the main amplifier stage. That is, the additional capacitive element may be configured to provide capacitive coupling between the main amplifier stage and ground, or a ground connection. The additional capacitive element may provide a low impedance route to earth for intermodulation products generated by the main amplifier stage. The at least one additional capacitive element may be galvanically coupled to the peak amplifier stage and the output conductor. The at least one additional capacitive element may be configured to provide capacitive coupling to the peak amplifier stage and the output conductor. That is, the additional capacitive element may be configured to provide capacitive coupling between the peak amplifier stage and ground. The additional capacitive element may be configured to provide capacitive coupling between the output conductor and ground. In this way the additional capacitive elements can provide output impedance matching.

The circuit may further comprise an additional terminal. The circuit may further comprise an additional bond wire. The additional bond wire may be provided to couple the least one additional capacitive element to the additional terminal. The additional bond wire can have an impedance that acts as a low pass filter for signals with a frequency corresponding to intermodulation frequency products.

The main amplifier stage may comprise a plurality of main amplifier substages. The peak amplifier stage may comprise a plurality of peak amplifier substages. Each of the main amplifier substages may be disposed on a separate transistor die. Each of the peak amplifier substages may be disposed on a separate transistor die. The provision of multiple transistor dies allows for improved power scaling capability.

The first and second main amplifier substages may be associated with a separate additional capacitor element. The first and second main amplifier substages may be associated with a separate input capacitive element.

Each peak amplifier substage may be associated with a separate output capacitive element. Each main amplifier substage may be associated with a separate output capacitive element.

The circuit may further comprise an output capacitive element. The output capacitive element may be configured to couple the output conductor to the output terminal. That is, the output capacitive element may be configured to provide capacitive coupling between the output conductor and ground. The output capacitive element may be configured to provide capacitive coupling between the output terminal and ground. The output capacitive element may be configured to galvanically couple the output conductor to the output terminal. The output capacitive element can provide impedance matching between the amplifier and an output load thereby improving the performance of the circuit.

The output terminal may be provided on an opposing side of the circuit to the main input terminal. The output terminal may be provided on an opposing side of the circuit to the peak input terminal. The main input terminal and peak input terminal may be provided on the same side of the circuit for ease of connection.

A "coupling" may be galvanic coupling unless otherwise stated, that is, a connection. A "galvanic coupling" may be considered to be a coupling that enables electron flow. In other words, a "galvanic coupling" may be considered to be an electrically conductive coupling. A galvanic coupling between two elements may be provided by a bond wire. Similarly, the term "connected" herein may mean galvanically connected. The term "connected" herein may also mean physically connected.

The spacing in the second direction of connections within the main input set of connections may correspond to the spacing of the connections of the main output set of connections. The spacing in the second direction of connections of the peak input set of connections may correspond to the spacing of the connections of the peak output set of connections. The spacing in the second direction of connections of the main input set of connections may correspond to the position of transistors of the main amplifier stage. The spacing in the second direction of connections of the peak input set of connections may correspond to the position of transistors of the peak amplifier stage.

The main amplifier stage may be situated between the main input conductor and the output conductor. The peak amplifier stage may be situated between the peak input conductor and the output conductor. The output conductor may be situated between the main and peak input conductors. These arrangements of the amplifier circuit may reduce the area that it occupies.

There is also disclosed a Doherty amplifier comprising:
main and peak stages;
main and peak input terminals coupled to the main and peak stages respectively;
an output terminal;
multiple equal-length conduction paths through the main stage between the main input terminal and the output terminal; and
multiple equal-length conduction paths through the peak stage between the peak input terminal and the output terminal.

A path length being equal to another path length may mean that the difference in path length results in substantially no, or sufficiently little, phase shift between signals taking the alternative paths. Substantially no phase shift may mean that the phase difference is less than (10, 5, 1, 0.1, 0.05 or 0.01) degrees between signals travelling along the two paths. A typical frequency for a signal to be amplified may be 100, 200, 500, 1,000 or 5,000 MHz. Alternatively a path length may be equal to another path length if the difference in path length is less than 10,000, 1,000, 100, 10 or 1 nm, for example.

In some embodiments, the impedance of the main input conductor and the peak input conductor may be designed to increase the phase shift in the signals propagating along the conductors so as to stagger the power demand of the individual transistors within main or peak amplifier stage. That is, a characteristic of the main input conductor and peak input conductor may vary as a function of distance from the associated input terminal. Such a characteristic may be a width of the input conductor.

The invention is described in more detail below by way of illustrative exemplary embodiments, with reference to the accompanying drawings in which:

FIG. 3c illustrates a side view of the schematic in FIG. 3a;

Disclosed herein is a device can provide one or more of: a compact, high power integrated Doherty power amplifier allowing for improved amplification RF and signal bandwidth, preserved phase coherency, easy power and frequency scaling and reduced size. The configuration may allow individual excitation of main and peak amplifier stages, making it suitable, among other things, for advanced amplifier concepts involving digital signal splitting.

Embodiments of the present invention are directed to amplifier circuits comprising multiple transistors within an amplifier stage, in which the output signals from the various transistors are combined and are substantially in-phase with each other at an output of the amplifier. In some embodiments, the multiple transistors within each amplifier stage are provided in parallel and are arranged with a linear spatial distribution on a transistor die or on multiple transistor dies. An input signal can be provided by an input conductor provided geometrically in parallel with the linear arrangement of transistors. A consequence of the linear arrangement of transistors is that a relative phase shift is introduced to input signals fed to the individual transistors, with an increase in the phase shift for the transistors situated further from an input of the amplifier. This phase shift is due to the time taken for signal propagation along the length of the linear arrangement of transistors. However, as the time taken for each transistor to process the signal can be substantially the same, these relative phase shifts are preserved at the outputs of the individual transistors. If output signals from the linear arrangement of transistors are combined along an output conductor that is also geometrically parallel with the linear arrangement of transistors, then the relative phase shifts of the output signals of the individual transistors can be cancelled out thereby bringing the signals back into phase with each other. This effect requires the input signal to be applied to the opposite end of the linear arrangement of transistors to which the output signal is collected, thereby ensuring that the total path length of all of the signal paths between the input and the output of the amplifier stage is the same.

Figure 1:
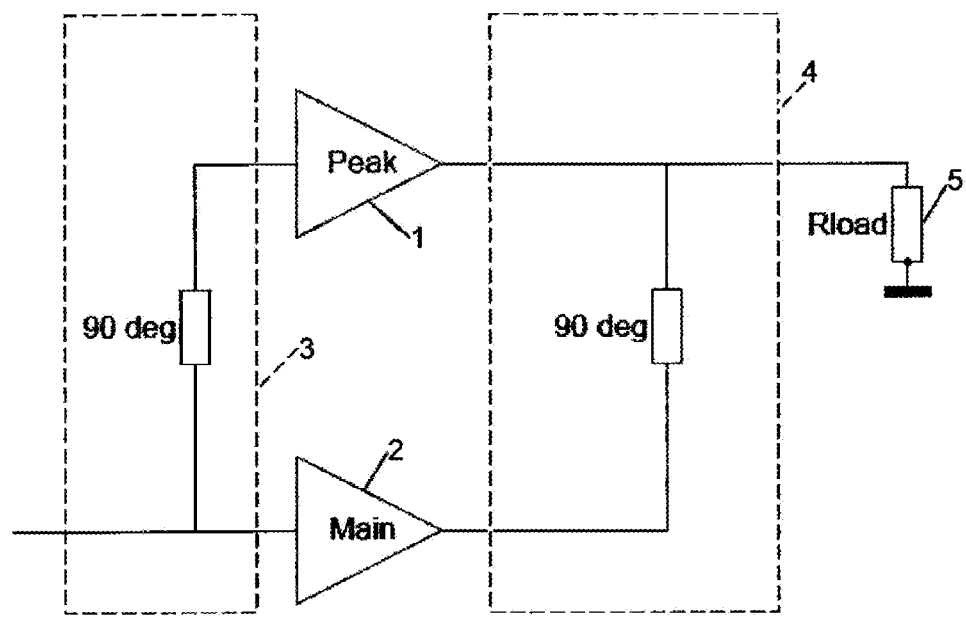
FIG. 1 illustrates a schematic of a Doherty amplifier circuit.

A two-way Doherty amplifier is illustrated in FIG. 1. The two-way Doherty amplifier comprises two amplifier stages 1, 2, a first of these being a peak amplifier 1 and a second being a main amplifier 2. The peak amplifier 1 amplifies a phase-shifted version of an input signal, while the main amplifier 102 amplifies an unshifted version of the input signal. The phase shift is introduced into the phase-shifted version of the input signal by the splitter stage 3. A combiner stage 4 combines the output signals from the amplifier stages 1, 2 in-phase and provides an output amplified signal to a load 5. The use of phase shifted peak signals lowers the instantaneous power consumption demand of the amplifier when receiving peak level signals.

A classic Doherty power amplifier (DPA), in a symmetric or asymmetric implementation, has become the contemporary industry standard for base station high efficiency amplifiers. To further improve performance, more recent implementations of Doherty amplifiers have been provided as single integrated circuit packages, rather than as discrete components. However, with the continuously increasing demand for higher RF bandwidth and higher data rate transmissions, the physical limits of the performance of prior art implementations are quickly being approached.

Discrete DPAs deliver high efficiency when operating with a RF bandwidth (BW) confined to a range of several tens of MHz. Among other factors, the BW of operation is limited by the presence of additional electrical length introduced by matching networks and extension lines, which may be required to ensure signal phase coherence and optimal functioning of the amplifier. Such components are typically placed between outputs of the two amplifying branches realized with discrete transistors and the power combiner.

An integrated solution partially overcomes these limitations in performance by combining the two amplifying branches prior to a matching network. Specific implementation of integrated solutions may require power combining to occur at a low power level. To achieve higher amplifier power output, a number of elementary cells (sets of main and peak power amplifiers) can be connected in parallel. However, in such an arrangement it is not possible to separately excite the individual pairs of main and peak power amplifier and so flexibility of operational bandwidth may be compromised. Some embodiments of the present invention address this issue by allowing separate excitation of the main and peak amplifier stage.

Integrated DPAs may also suffer from undesired electrical feedback loops as the main amplifier(s) and peak amplifier(s) share the same substrate, and thus degrade the performance of the amplifier, including its gain and stability. To overcome this limitation, embodiments of the present invention allow multiple transistor dies to house the main and peak amplifier stages.

Further, both discrete and integrated DPAs provide a limited operational bandwidth imposed by the input phase and power distribution networks. Indeed, integrated solutions often provide a more limited operational bandwidth in practical applications due to these considerations. The present invention allows for improved bandwidth by allowing in-phase recombination of signals amplified by transistors within each of the amplifier stages and by reducing the phase shift necessary for recombining main and peak signals.

Figure 2:
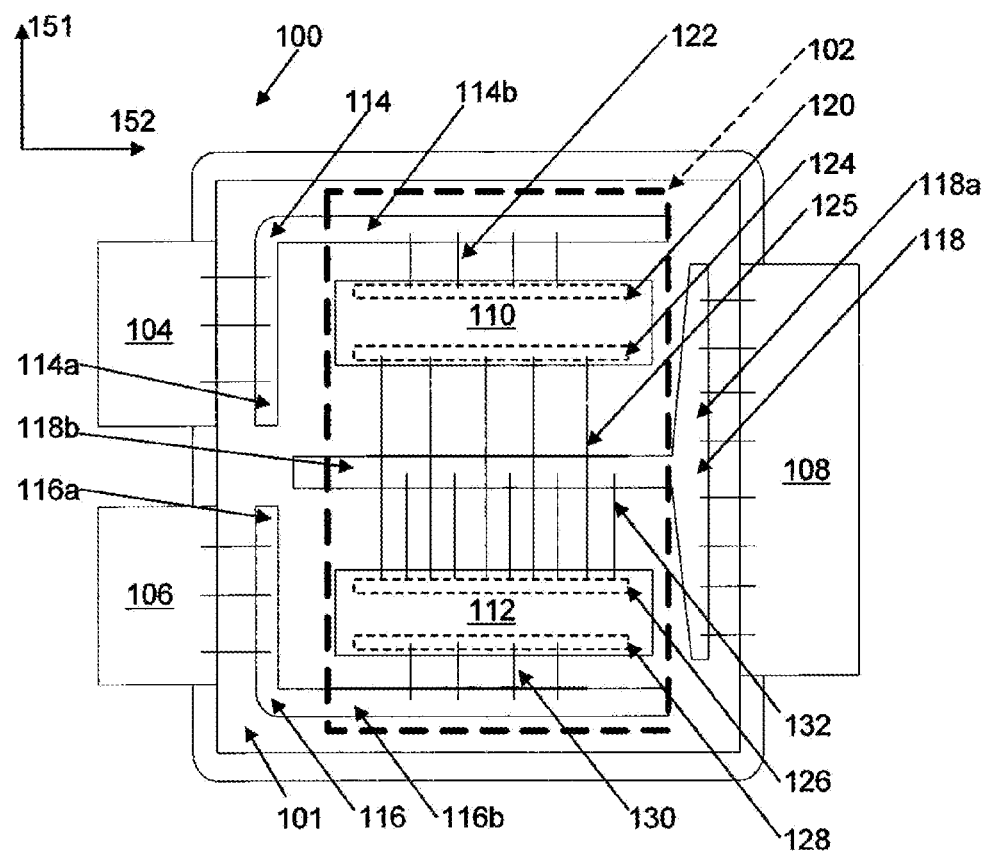
FIG. 2 illustrates a top view of a circuit configuration in accordance with an embodiment of the invention.

FIG. 2 illustrates a Doherty amplifier circuit 100 in accordance with an embodiment of the invention. The Doherty amplifier circuit 100 comprises a main amplifier stage 110 and a peak amplifier stage 112. The circuit 100 is disposed on a planar substrate 101 that has a first direction 151 and a second direction 152. Both the first and second directions 151, 152 are in the plane of the substrate 101. The first direction 151 is normal to the second direction 152. The second direction 152 may be considered to be the input-output direction of signal propagation through the circuit 100.

Two separate large LDMOS transistors dies may be suitable for use as the main and peak amplifier stages 110, 112 of the Doherty amplifier circuit 100. The transistor dies may provide a peak power output of 200-250 W or more from a configuration such as that illustrated in FIG. 2.

The arrangement illustrated in FIG. 2 is applicable to a symmetric configuration, where the main and peak amplifier stages 110, 112 have equal total gate width, or an asymmetric configuration where the main and peak amplifier stages 110, 112 have an unequal total gate width. The main and peak amplifier stages 110, 112 can have similar geometrical dimensions.

Doherty amplifier circuit 100 also comprises a main input terminal 104, a peak input terminal 106 and an output terminal 108. Signals can be applied to the main and peak input terminals 104, 106. The signals can be phase shifted by 90 degrees (¼ wavelength) relative to each other before they are provided to the main and peak input terminals 104, 106. The two separate input terminals 104, 106 allow for individual excitation of the main and peak amplifier stages 110, 112. This arrangement allows for digitally controlled input signal splitting, which ensures improved performance for a wider bandwidth.

The Doherty amplifier circuit 100 also comprises a main input conductor 114 and a peak input conductor 116 that are offset from one another in the first direction 151. The main and peak input conductors 114, 116 in this embodiment each have an 'L' shape. The main input conductor 114 and the peak input conductor 116 can each be considered to have first portions 114a, 116a and second portions 114b, 116b. The first portions 114a, 116a of the main and peak input conductors 114, 116 both extend in the first direction 151. The second portions 114b, 116b of the main and peak input conductors 114, 116 both extend in the second direction 152. The second portion 114b of the main input conductor 114 extends alongside the main amplifier stage 110. The second portion 116b of the peak input conductor 116 extends alongside the peak amplifier stage 112.

The second portions 114b, 116b of the main and peak input conductors 114, 116 can each be considered to have an input end (on the left hand side in FIG. 2). The first portions 114a, 116a of the main and peak input conductors 114, 116 are connected to respective second portions 114b, 116b at the input ends of the associated second portions 114b, 116b.

The first portions 114a, 116a of the main and peak input conductors 114, 116 are connected to the main and peak input terminals 104, 106 as described in more detail below. These connections provide the input signals from the input terminals 104, 106 to the input ends of the respective second portions 114b, 116b of the main and peak input conductors 114, 116. In some other embodiments, the first portion 114a of the main input conductor 114 and/or the first portion 116a of the peak input conductor 116 may be omitted. In such embodiments, the input end of the second portion 114b, 116b of the main or peak input conductor 114, 116 may be connected directly to an associated input terminal 104, 106.

The circuit 100 also contains an output conductor 118 for receiving signals that have passed through: i) the peak amplifier 112; and ii) the main amplifier 110. Further details are provided below. The output conductor 118 has a first portion 118a that extends in the first direction 151 and a second portion 118b that extends in the second direction 152 between the main amplifier stage 110 and the peak amplifier stage 112. A midway point of the first portion 118a of the output conductor 118 is coupled to an end of the second portion 118b of the output conductor 118. The output conductor 118 in this example forms a 'T' shape.

The output terminal 108 is coupled to the first portion 118a of the output conductor 118. Any, or all, of the main input conductor 114, peak input conductor 116 or output conductor 118 may be implemented, for instance, as metal tracks on the dielectric substrate 101. In some other embodiments the second portion 118b of the output conductor 118 alone may be considered to be the output conductor 118.

The main amplifier stage 110 is situated between the second portion 114b of the main input conductor 114 and the second portion 118b of the output conductor 118, which are all displaced from one another in the first direction 151. The main amplifier stage 110 has a main stage input 120 and a main stage output 124 on opposing edges. The main amplifier stage 110, as well as its input 120 and output 124, extends in the second direction 152. The main stage input 120 faces and is parallel with the second portion 114b of the main input conductor 114. A main input set of connections 122 provides a plurality of galvanic conduction paths (four are shown in FIG. 2) to connect the main stage input 120 to the main input conductor 114. The galvanic conduction paths allow currents representative of signals to flow along the connections. The various connections illustrated in the figures can be provided by bond wires. The main stage output 124 feeds, and is parallel with, the second portion 118b of the output conductor 118. The main stage output 124 in this example is indirectly coupled to the output conductor 118 via the peak amplifier stage 112, as described below.

The peak amplifier stage 112 is situated between the second portion 116b of the peak input conductor 116 and the second portion 118b of the output conductor 118, which are all displaced from one another in the first direction 151. The peak amplifier stage 112 has a peak stage input 128 and a peak stage output 126. The peak amplifier stage 112, as well as its input 128 and output 126, extends in the second direction 152. The peak stage input 128 faces and is parallel with the second portion 116b of the peak input conductor 116. A peak input set of connections 130 provides a plurality of galvanic conduction paths (four are shown in FIG. 2) to connect the peak stage input 128 to the peak input conductor 116.

The peak stage output 126 faces and is parallel with the second portion 118b of the output conductor. The second portion 118b of the output conductor is between the peak stage output 126 of the peak amplifier 112 and the main stage output 124 of the main amplifier 110. The peak stage output 126 is also parallel with the second portion of the output conductor 118b.

A peak output set of connections 132 provides a plurality of galvanic conduction paths (five are shown in FIG. 2) to connect the peak stage output 126 to the output conductor 118.

In the example shown in FIG. 2, a main output set of connections 125 provides a plurality of galvanic conduction paths (five are shown in FIG. 2) to connect the main stage output 124 directly to the peak stage output 126. Signals from the main stage output 124 can then pass to the output conductor 118 via the peak output set of connections 132. An advantage of direct connection between the main stage output 124 and the peak stage output 126, instead of directly to the output conductor 118, is that the main and peak amplifier stages 110, 112 may be placed closer together while still providing the required 90 degree phase shift between the main stage output 124 and the peak stage output 126. In this example, the output signals of the main and peak amplifier stages 110, 112 are combined at the peak stage output 126. Indeed, because the amplifier stage 110, 112 components can be placed so close together because of this design, the main output set of connections 125 can be configured to provide a 90 degree phase shift at an operating frequency of the amplifier, rather than an odd integer multiple of 90 degrees that would be required by a longer connection (a 270 or 540 degree phase shift may be required, for example, if it is not possible to achieve a 90 degree phase shift). Reducing the phase shift introduced by the amplifier 100 can allow its bandwidth to be increased. Therefore, by combining the signals from the main and the peak amplifier stages 110, 112 directly on the transistor dies, the arrangement illustrated in FIG. 2 provides a substantially wider operational bandwidth.

Alternatively, the main output set of connections 125 could connect the main stage output 124 directly to the output conductor 118.

The main and peak amplifier stages 110, 112 each comprise a number of elementary cells (transistors). The transistors can be arranged linearly and functionally in parallel. The transistors can be field effect transistors. Such transistors each have drains that collectively form the peak and main stage inputs 120, 128 and gates that collectively form the peak and main stage outputs 124, 126.

The individual transistors can be arranged in parallel along the second direction 152. A consequence of this arrangement is that a relative phase shift is introduced to the signals fed to the transistors situated further from the main or peak input terminals 104, 106 due to the delay in signal propagation along the length of the second portions of the respective main or peak input conductors 114, 116. Similarly, the output signals of the individual transistors are combined along the length of the peak stage output 126 to ensure the in-phase combining of all amplified signals, thus preserving output signal coherency. That is, it will be understood that in the example shown in FIG. 2, output signals from the main and peak amplifier stages 110, 112 are combined in-phase with each other at the peak stage output 126.

The peak output set of connections 132 couples the main stage output 124, as well as the peak stage output 126, to the output conductor 118. Alternatively, the peak stage output 126 could be considered to comprise the output conductor 118, in which case the peak output set of connections 132 are not required. In this alternative, the output terminal could be connected directly to an end of the peak stage output 126 (on the right hand side in the embodiment of FIG. 2).

In the embodiment illustrated in FIG. 2, where the main output set of connections 125 directly couples the main stage output 124 to the peak stage output 126, the phase shift introduced between the main input terminal 104 and the main stage input 122 should be equal to the phase shift introduced between the peak input terminal 106 and the peak stage input 128 to ensure that the signals are combined in-phase with each other at the peak stage output 126. However, the absolute value of the phase delay introduced at the input side of the respective amplifier stages (which can be considered to include all connections and conductors between an input terminal and the associated amplifier stage input) may not be important for the proper functioning of the circuit 100; it merely needs to be the same for both stages. In many applications, the phase delays created by the main input set of connections 122 and the peak input set of connections 130 can be equal to each other for ease of circuit design. That is, the number of bond wires used to implement the connections could be the same for the main and peak input sets of connections 122, 130.

Figure 3A:
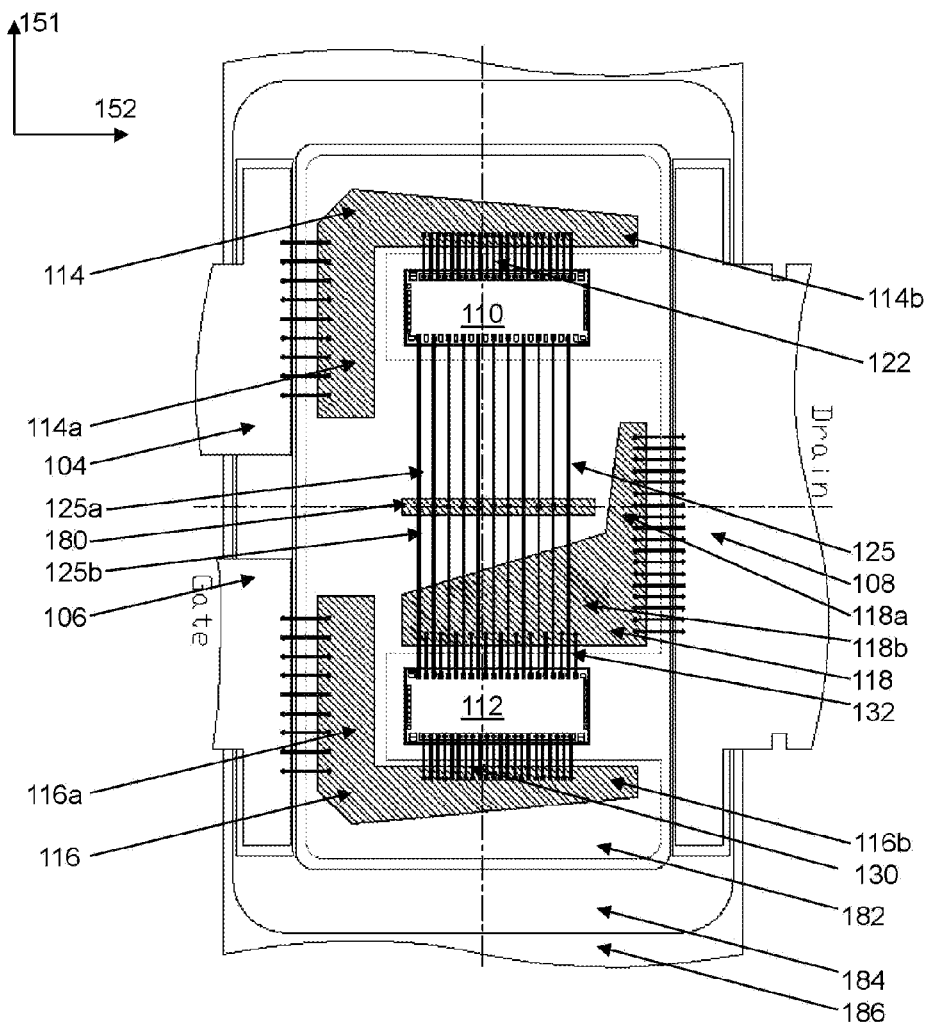
FIG. 3a illustrates a schematic of an implementation of the circuit of FIG. 2.

FIG. 3a shows a schematic of an implementation of the circuit 100 shown in FIG. 2. The same reference numerals are used in FIG. 3 as in FIG. 2.

The circuit 100 is located on a planar substrate 101 comprising a dielectric substrate 182. The dielectric substrate 182 may comprise silicon or laminate, for example. An insulator ring 184 extends around the dielectric substrate 182. The insulator ring 184 may be a ceramic. The dielectric substrate 182 and the insulator ring 184 are provided on top of a conductor layer 186. The conductor layer 186 may comprise metal. The dielectric substrate 182 is in direct contact with the conductor layer 186. Capacitive element on the reverse face of the dielectric substrate are therefore in contact with the conductor layer 186. The conductor layer 186 may extend to form a flange, which can be used to ground the conductor layer and to secure the circuit to an external device or board.

The embodiment of FIG. 3a differs from that shown in FIG. 2 in that a bridge conductor 180 is shown. The bridge conductor 180 extends in the second direction 152 and is situated between the main amplifier stage 110 and the peak amplifier stage 112.

The main output set of connections 125 need to be of a specific length in order to provide impedance that result in a 90 degree phase shift. However, the length of wire that this necessitates in some applications leads to bond wires that are so long that they may become tangled or require additional support. The bridge conductor 180 can assist in the provision of a suitably long main output set of connections 125.

In FIG. 3a, the main output set of connections 125 comprises a first portion 125a and a second portion 125b. The first portion 125a connects the main stage output 124 to the bridge conductor 180. The second portion 125b connects the bridge conductor 180 to the peak output stage 126.

The output conductor 118 in this example forms an 'L' shape. It will be appreciated that the output conductor 118 can take a number of shapes. However, the output conductor 118 must extend at least in the second direction 152.

Figure 3C:
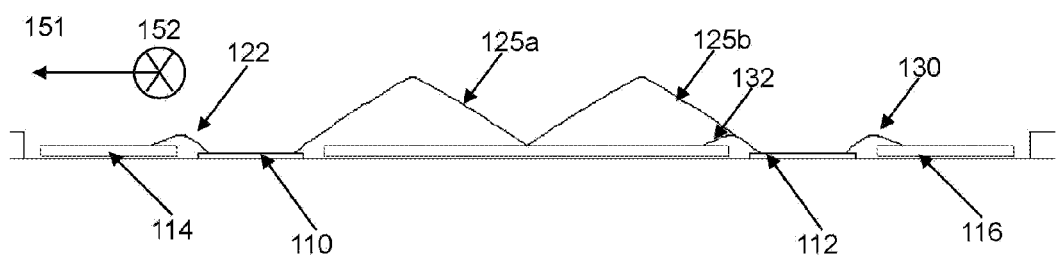
Figure 3B:
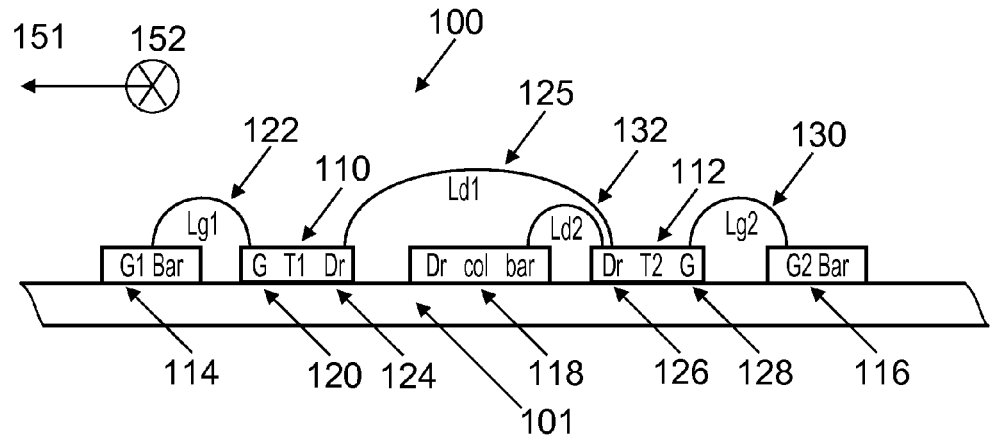
FIG. 3b illustrates a side view of the circuit illustrated in FIG. 2.

FIG. 3b shows a cross-section of the circuit 100 shown in FIG. 2. From FIG. 3b is can be seen that the main input set of connections 122, main output set of connections 125, peak input set of connections 130, peak output set of connections 132 are provided by loops of bond wire. Each loop of bond wire has a specific impedance. The impedance of a set of bond wires is dependent on the number of connections within the set, their height, thickness, material that they are made out of, and external environmental conditions. Adding additional bond wires in parallel increases the power transport capability of a set of connections.

However, this addition also reduces the specific impedance of the set of connections as a whole. This reduction in the impedance of the bond wires, and so the signal propagation delay (phase shift) that they introduce, can be compensated for by changing the length and height of the bond wires.

The arrangement illustrated in FIG. 3b allows a circuit designer to easily tune, or optimise, the circuit for use at different RF frequency bands of operation by varying the length of the connections 122, 125, 130, 132 (thereby adjusting the height of the loop) and/or the distance between the transistor dies of the main and peak amplifier stages 110, 112, if necessary. If the length of the main output set of connections 125 is required to be prohibitively long in order to provide the necessary phase shift, an intermediate support (not shown) may be used. In particular, the intermediate support can be provided by a metal strip on a dielectric substrate with bond wire connections thereon. Alternatively, a calculated value of a MOS capacitor may be used in addition to a bond wire connection in order to modify the inductance, in which case the required physical length of the main output set of connections 125 can be reduced.

In practice, drain side currents may be larger than gate side currents and so more bond wires can be used at the stage outputs 124, 126 than at the stage inputs 120, 128 in order to transport this additional current.

FIG. 3c illustrates a side view of the schematic in FIG. 3a. The schematic of FIG. 3c is substantially the same as the circuit cross-section shown in FIG. 3b. However, a side view of the arrangement of the bridge connector 180 (described above with reference to FIG. 3a) is visible in FIG. 3c.

It will be appreciated that one or more of the features that are illustrated in FIGS. 2 and 3 can be considered as optional inasmuch as it is still possible to achieve one or more of the advantages disclosed herein without them.

Figure 4:
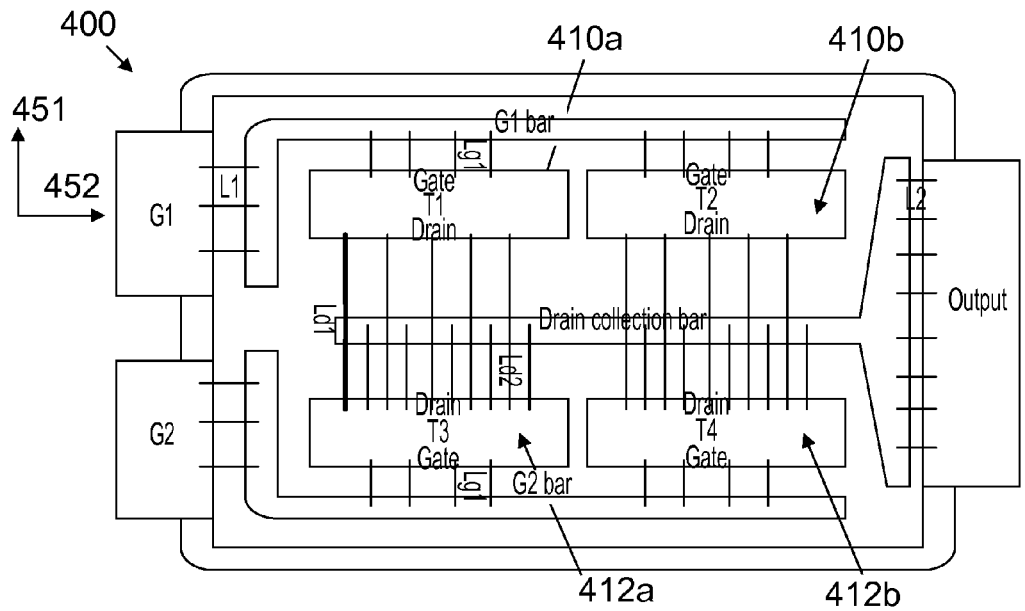
FIG. 4 illustrates a circuit with multiple main and peak substages.

FIG. 4 illustrates a circuit 400 according to another embodiment of the invention. Corresponding reference numerals will be used where common features exist between figures. For the most part, substantially the same feature will not be discussed separately for subsequent diagrams.

FIG. 4 illustrates an example in which the power output capability of the circuit 400 can be easily scaled-up while preserving output phase coherency. In FIG. 4, the power scaling is achieved by connecting two or more amplifier substages, in parallel. The amplifier substages are transistor dies that are similar to the amplifier stages 110, 112 illustrated in FIG. 3a. Where multiple transistor dies are used for each amplifier stage, the amplifier stage can be considered to comprise a plurality of amplifier substages.

In FIG. 4, the main stage amplifier comprises first and second main amplifier substages 410a, 410b displaced from one another in the second direction 452. The peak stage amplifier comprises first and second peak amplifier substages 412a, 412b, displaced from one another in the second direction 452.

In addition or alternatively to increasing the number of transistor dies in order to increase the power output capability of the amplifier circuit 400, the gate width of the transistor dies can be increased.

Figure 5:
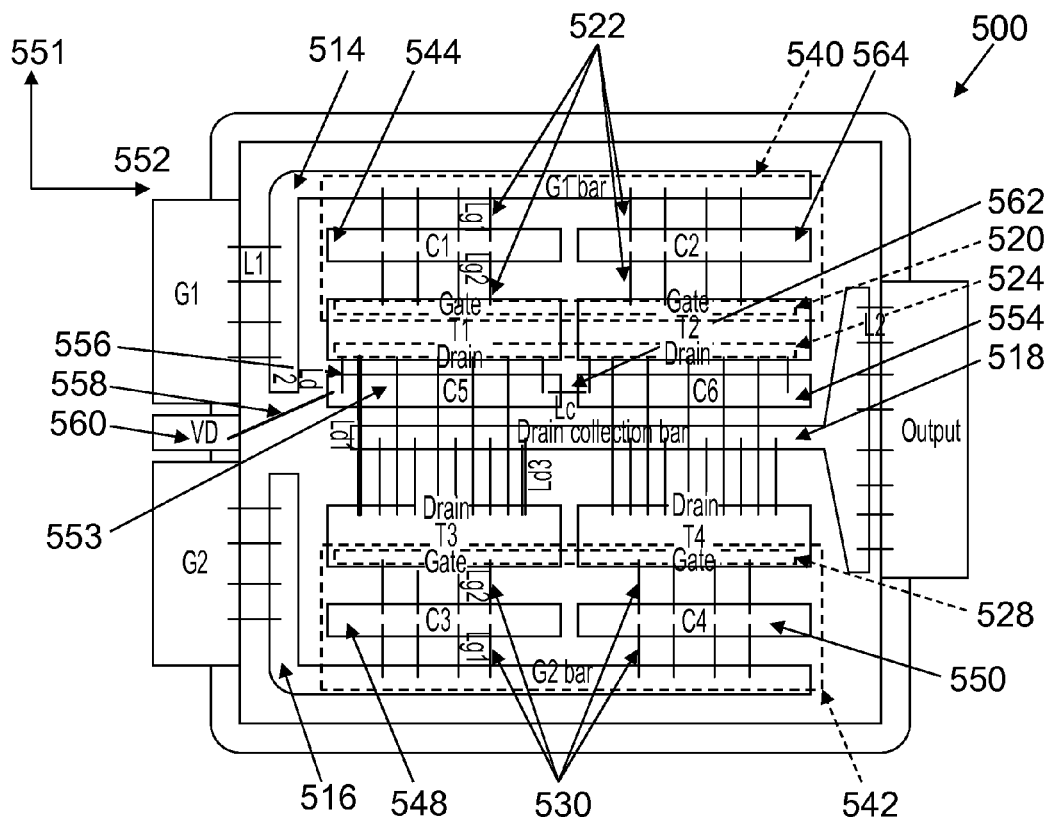
FIG. 5 illustrates a circuit with input capacitive elements and a $2^{nd}$ order harmonics output terminal.

FIG. 5 illustrates a circuit 500 according to another embodiment of the invention comprising a main pre-matching network 540 and a peak pre-matching network 542. The basic functionality of the Doherty amplifier circuit can be extended by the provision of input pre-matching networks for one or more, or all, of the individual transistor dies. This can improve power performance by reducing input mis-match.

The main pre-matching network 540 consists of MOS capacitor elements 544, 546 and the main input set of connections 522. The main capacitor elements 544, 546 both extend in the second direction 552 and are displaced from one another in the second direction 552. The main capacitor elements 544, 546 are situated between the main input conductor 514 and the main stage input 520. The main capacitor elements 544, 546 are each displaced from the main input conductor 514 and the main stage input 520 in the first direction 551. Respective first plates of the main capacitor elements 544, 546 are coupled to both the main input conductor 514 and the main stage input 520. Respective second plates (not visible in FIG. 5) of the main capacitor elements 544, 546 are configured to be coupled to ground. The main capacitor elements 544, 546 are also galvanically coupled to both the main input conductor 514 and the main stage input 520 by the main input set of connections 522. It will be appreciated that the main capacitor elements 544, 546 can, as an alternative, be provided by a continuous main input capacitor element.

The peak pre-matching network 542 consist of MOS capacitors elements 548, 550 and the peak input set of connections 530. The peak capacitor elements 548, 550 both extend in the second direction 552 and are displaced from one another in the second direction 552. The peak capacitor elements 548, 550 are situated between the peak input conductor 516 and the peak stage input 528. The peak capacitor elements 548, 550 are each displaced from the peak input conductor 516 and the peak stage input 528 in the first direction 551. The peak capacitor elements 548, 550 are coupled to both the peak input conductor 516 and the peak stage input 528. Respective first plates of the peak capacitor elements 548, 550 are also galvanically coupled to both the peak input conductor 516 and the peak stage input 528 by the peak input set of connections 530. Respective second plates (not visible in FIG. 5) of the peak capacitor elements 548, 550 are configured to be coupled to ground. It will be appreciated that the separate peak capacitor elements 544, 546 can, as an alternative, be provided by a continuous peak input capacitor element.

The embodiment shown in FIG. 5 also comprises first and second additional capacitor elements 553, 554 that are positioned between the main stage output 524 and the output conductor 518. The additional capacitor elements 553, 554 can act as part of an impedance path to an additional terminal 560. This arrangement can allow a route to earth for unwanted intermodulation signals that are generated by the main amplifier stage.

The first and second additional capacitor elements 553, 554 are displaced from the main stage output 524 and the output conductor 518 in the first direction 551.

The first additional capacitor element 553 and the second additional capacitor element 554 are coupled to the main stage output 524. Respective first plates of the first additional capacitor element 553 and the second additional capacitor element 554 are galvanically coupled to the main stage output 524 by a first additional element connection 556, which is provided by a bond wire or wires. Respective second plates (not visible in FIG. 5) of the peak capacitor elements 548, 550 are configured to be coupled to ground. The inductance of the first additional element connection 556 can be configured to provide a very low impedance for some relatively low frequency signals. A third additional element connection 558, which is provided by a bond wire or wires, couples the first additional capacitor element 553 to an additional terminal 560.

A resonance frequency is provided by a parallel resonance (or tank) circuit in which the drain-source capacitance of the main amplifier stage is connected in parallel with a series combination of the first additional element connection 556 and the first additional capacitor elements 553. The resonance frequency can be chosen to be outside the band of operation of the Doherty amplifier circuit 500. Preferably, the resonance frequency should be 200-300 MHz or more below the band of operation so as to avoid interfering with the operation of the amplifier.

One terminal of the first additional capacitor element 553 is connected to ground and the second terminal via the additional element connection 558 to the additional terminal 560. A high capacitance capacitor can also be provided externally to the circuit shown in FIG. 5 and connected between the additional terminal 560 and ground. Such a configuration can provide a low impedance route for 2nd order intermodulation products generated by the power amplifier (PA). This configuration can also improve the ability of the PA to amplify signals whilst minimising the level of distortion added to the signals and to allow amplification to occur with a wider modulation bandwidth. If the capacitance provided by the first and second additional capacitor elements 553, 554 is sufficiently large that it can provide a low impedance route for the 2nd order products from the main stage output 524 to ground by itself, the external capacitor and the additional terminal 560 may not be necessary.

The first additional capacitor element 553 and the second additional capacitor element 554 are displaced from one another in the second direction 552. The first additional capacitor element 553 and the second additional capacitor element 554 are galvanically coupled to each other by a third additional element connection 562, which is provided by a bond wire or wires. It will be appreciated that the separate peak capacitor elements 544, 546 can, as an alternative, be provided by a continuous peak input capacitor element.

Figure 6:
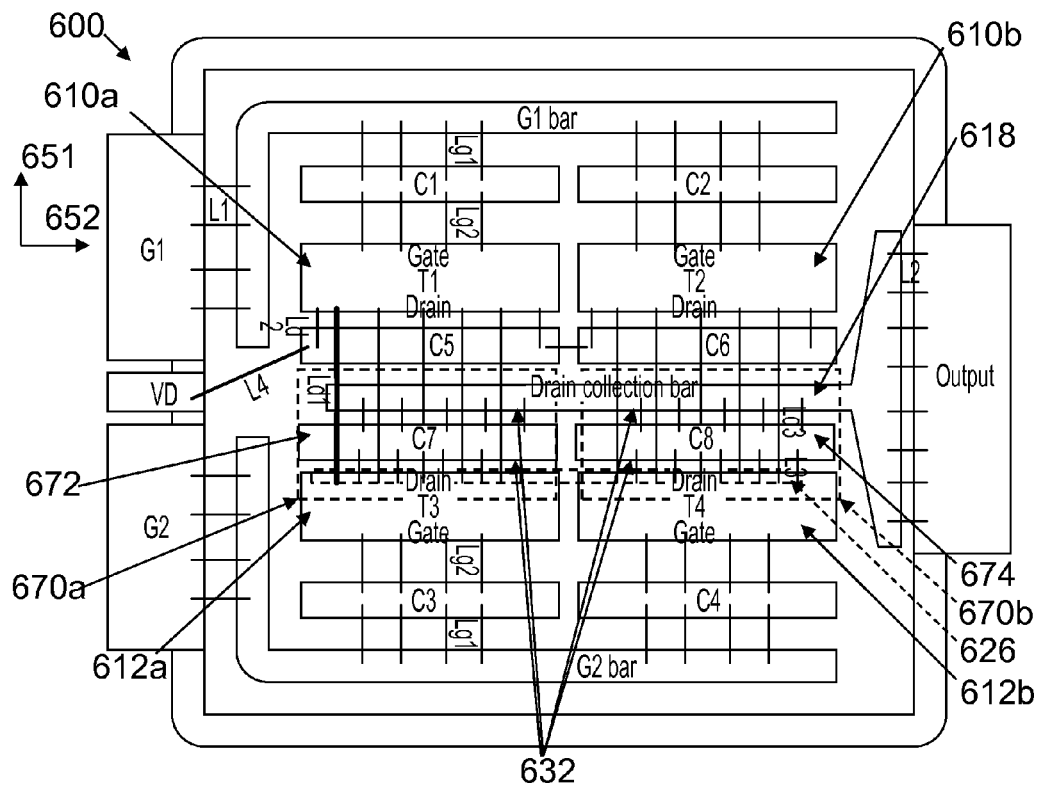
FIG. 6 illustrates a circuit with separate output matching networks for each peak substage.

FIG. 6 illustrates a circuit 600 according to an embodiment of the invention with individual, or separate, first and second output matching networks 670a, 670b for separate substages 610a, 610b, 612a, 612b to improve the interfacing (impedance matching) with an external load coupled to the output terminal. Improving output impendence matching results in more efficient power transfer.

The first and second matching networks 670a, 670b each consist of a MOS capacitor element 672, 674 and a subset of the peak output set of connections 632. Each peak amplifier substage 612a, 612b has its own matching network 670a, 670b (each including an output capacitor element 672, 674) associated with it. That is, the first peak amplifier substage 612a is galvanically coupled to a first plate of the output capacitor element 672 and the second peak amplifier substage 612b is galvanically coupled to a first plate of the output capacitor element 674. Respective second plates (not visible in FIG. 6) of the output capacitor elements 672, 674 are configured to be coupled to ground The output capacitor elements 672, 674 both extend in the second direction 652 and are displaced from one another in the second direction 652. The output capacitor elements 672, 674 are situated between the output conductor 618 and the peak stage output 626 and displaced from the output conductor 618 and the peak stage output 626 in the first direction 651. The output capacitor elements 672, 674 are coupled to both the output conductor 618 and the peak stage output 626. The output capacitor elements 672, 674 are also galvanically coupled to both the output conductor 618 and the peak stage output 626 by the peak output set of connections 632. It will be appreciated that the separate output capacitor elements 644, 646 can, as an alternative, be provided by a continuous output input capacitor element.

Figure 7:
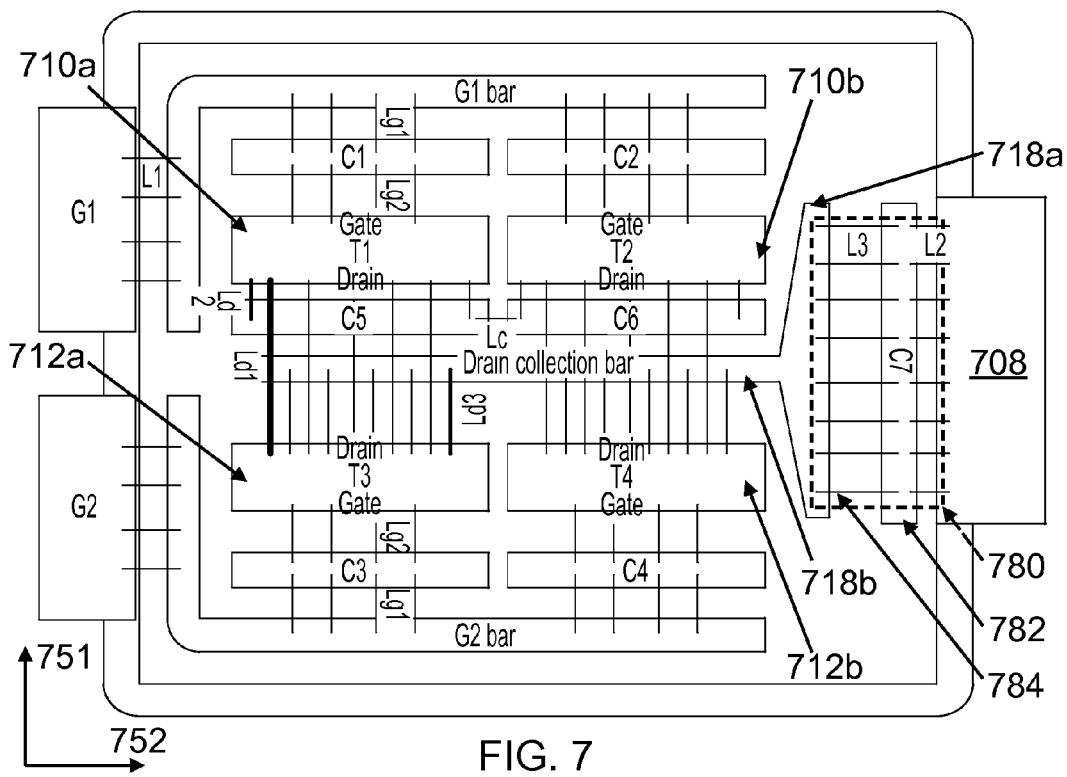
FIG. 7 illustrates a circuit with a common output matching network

FIG. 7 illustrates a circuit 700 according to an embodiment of the invention with a common output matching network 780 for the first and second main amplifier substages 710a, 710b and the first and second peak amplifier substages 712a, 712b. Improving output impendence matching results in more efficient power transfer.

The common output matching network 780 comprises the first portion 718a of the output conductor, an output capacitive element 782, an output set of connections 784 and the output terminal 708.

The first portion of the output conductor 718a extends in the first direction 751 and is coupled to a second portion 718b of the output conductor 718 which extends in the second direction 752. The output terminal 708 can also be considered to extend in the first direction 751. The output capacitive element 782 also extends in the first direction 751 and is situated between the first portion of the output conductor 718a and the output terminal 708. A first plate of the output capacitive element 782 couples the first portion 718a of the output conductor and the output terminal 708. A second plate (not visible in FIG. 7) of the output capacitor elements 782 is configured to be coupled to ground. The output set of connections 784 provides a galvanic coupling between the first portion 718a of the output conductor and the first plate of the output capacitive element 782 and also between the first plate of the output capacitive element 782 and the output terminal 708.

In both the embodiment of FIG. 6 and of FIG. 7, the positioning of the output matching network 670, 780 after the combining of the signals from the peak and main amplifier stage output at the peak stage output 626, 726 improves the operational bandwidth of the Doherty amplifier circuit 600, 700 and reduces the requirements for load impedance matching at the output terminal 608, 708.

Figure 8:
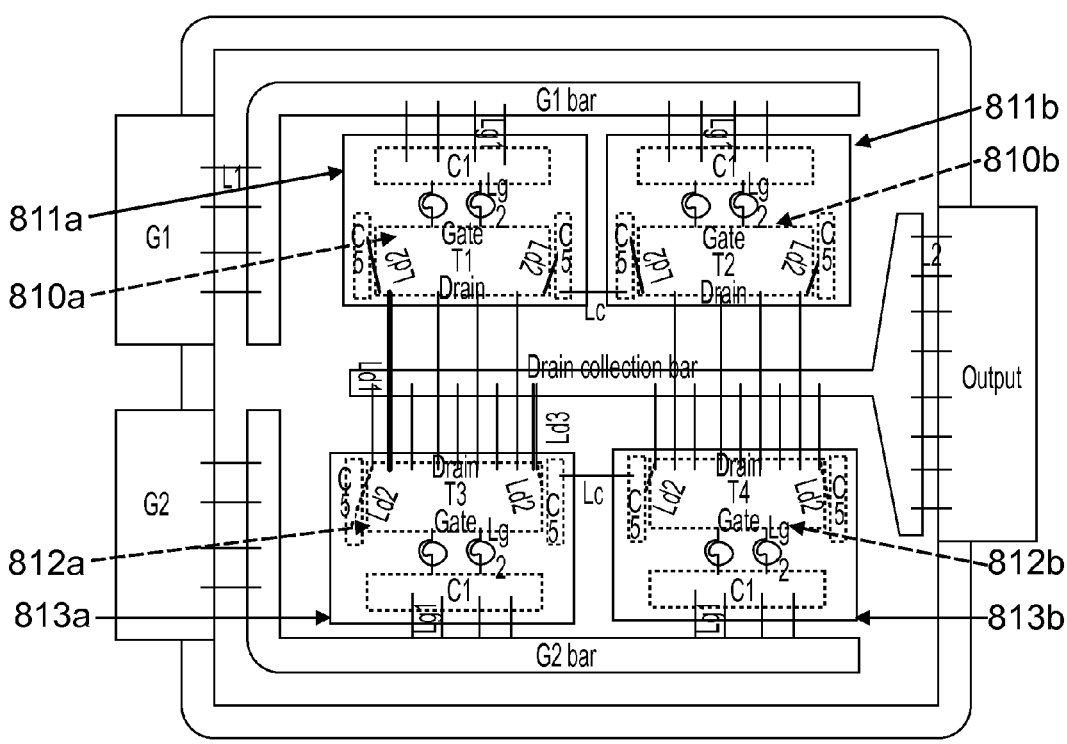
FIG. 8 illustrates a circuit where each substage is provided on a separate transistor die.

FIG. 8 shows an embodiment of the invention in which all of the passive components associated with each of the amplifier substages 810a, 810b, 812a, 812b can be integrated on a respective transistor die 811a, 811b, 813a, 813b. Each transistor die 811a, 811b, 813a, 813b comprises an amplifier substage 810a, 810b, 812a, 812b with a substage input and a substage output, and an input capacitive element, amongst other things. The layout of the transistor die of a representative substage will be discussed in further detail with reference to FIG. 9.

Figure 9:
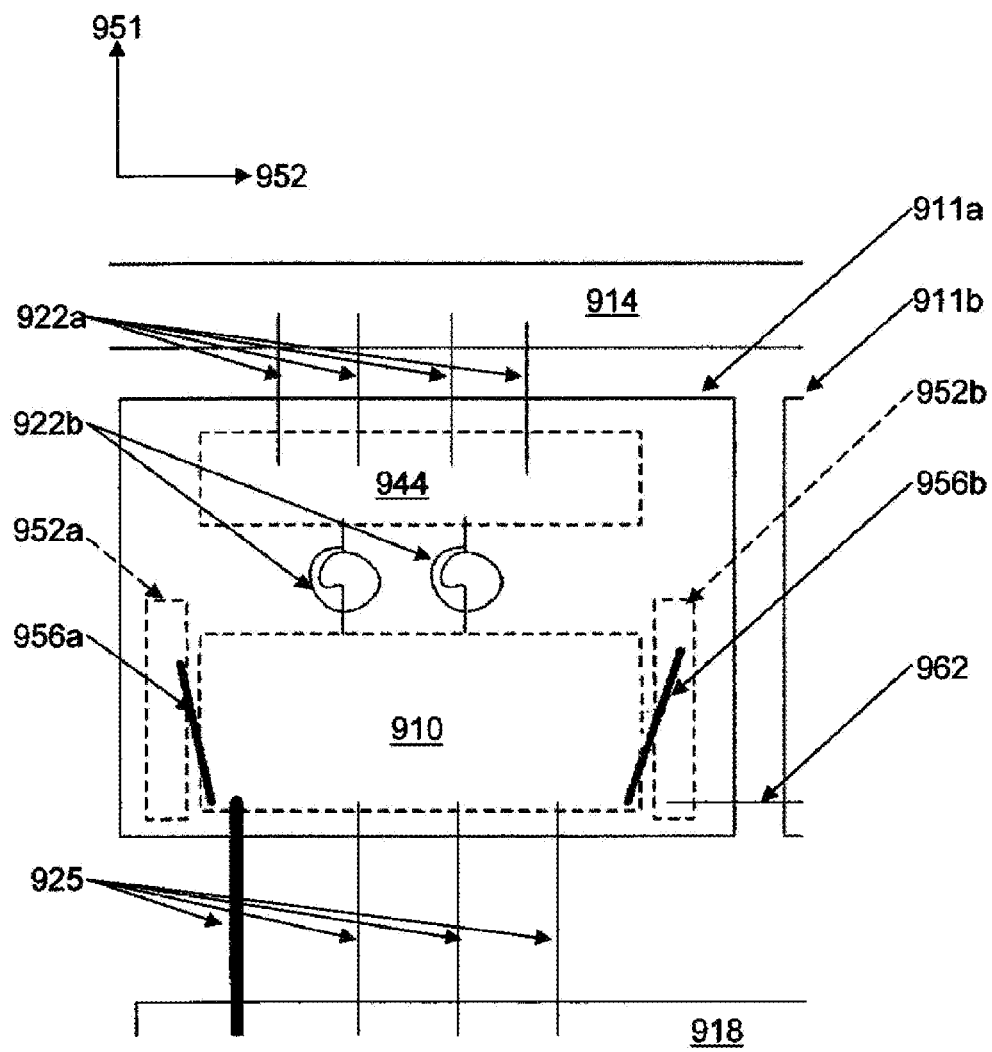
FIG. 9 illustrates a transistor die representative of those in FIG. 8.

The components shown in the representative substage 910a of FIG. 9 can relate to many different components referred to in previous figures. For example, it will be understood that the substage 910a of FIG. 9 can relate to the main substages 810a, 810b or the peak substages 812a, 812b of FIG. 8.

The embodiment of FIG. 9 illustrates an input conductor 914 and an output conductor 918 that both extend in a second direction and are separated from one another in the first direction 951. A transistor die 911a is situated between the input conductor 914 and the output conductor 918. An additional transistor die 911b is situated next to the transistor die 911a, that is, displaced from it in the second direction 952.

The transistor die 911a comprises an amplifier substage 910 having a substage input and a substage output, an input capacitive element 944, first and second capacitive output elements 952a, 952b and integrated inductors 922b. The capacitive element 944 is positioned on the transistor die 911a so as to face the input conductor 914. Bond wires 922a of an input set of connections galvanically couple the input conductor 914 to first plate of the input capacitive element 944. A second plate (not visible in FIG. 9) of the input capacitive element 944 is configured to be coupled to ground. The input set of connections also comprises integrated inductors 922b on the chip, or alternatively bond wires that galvanically couple the first plate of input capacitive element 944 to the substage input. Bond wires 956a, 956b of a capacitive set of connections couple the substage output to the first and second capacitive output elements 952a, 952b. The substage output faces the output collector 918 and is coupled to the output collector 918 by an output set of connections 925 (via components not shown in FIG. 9).

An additional element connection 962 provided by a bond wire couples the first plate of second capacitive output elements 952b of the transistor die 911a to a first capacitive output element of the additional transistor die 911b. A second plate (not visible in FIG. 9) of the second capacitive output elements 952b is configured to be coupled to ground.

Figure 10:
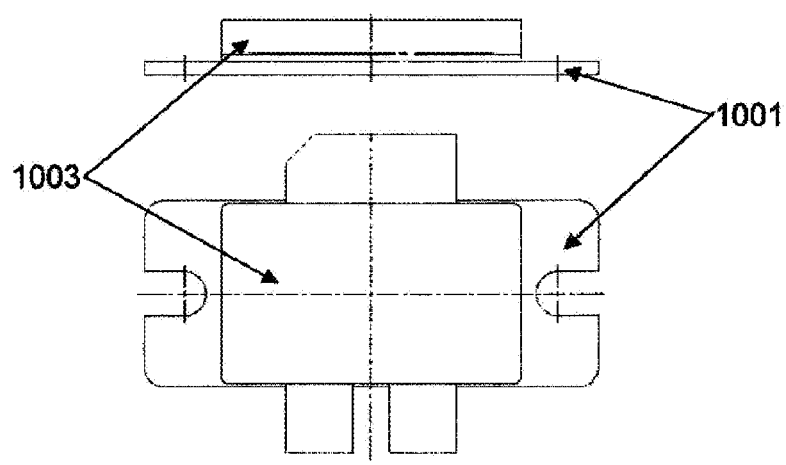
FIG. 10 illustrates a pack device that may comprise an embodiment of the invention.

FIG. 10 illustrates a packed device that can comprise an embodiment of the invention. The planar substrate of FIG. 10 comprise metal and is surrounded by a metal flange 1001. The planar substrate and the metal flange may be of monolithic construction. Second capacitive plates of the various capacitor elements can be in direct physical and electrical contact with the planar substrate. The metal flange 1001 may be used as ground terminal, thus enabling the connecting between the respective second plates of the capacitive elements and ground.

The transistor dies, capacitor elements and the dielectric substrate 1003 can be assembled on metal flange 1001.

The invention claimed is:

1. An integrated Doherty amplifier circuit comprising;
a main input terminal, a peak input terminal and an output terminal;
a main input conductor and a peak input conductor that are offset from one another in a first direction, wherein the main and peak input conductors both extend in a second direction that is perpendicular to the first direction, and wherein an input end of the main input conductor is coupled to the main input terminal and an input end of the peak input conductor is coupled to the peak input terminal;
an output conductor that extends in the second direction, wherein an output end of the output conductor is coupled to the output terminal;
a main amplifier stage that extends in the second direction and has a main stage input and a main stage output;
a peak amplifier stage that extends in the second direction and has a peak stage input and a peak stage output;
a main input set of connections configured to couple the main stage input to the main input conductor;
a main output set of connections configured to couple the main stage output to the output conductor;
a peak input set of connections configured to couple the peak stage input to the peak input conductor; and
a peak output set of connections configured to couple the peak stage output to the output conductor; and
wherein the main output set of connections indirectly couples the main stage output to the output conductor via the peak stage output and the peak output set of connections.

2. The circuit of claim 1, wherein the main amplifier stage comprises a plurality of main transistors spaced apart in the second direction and the peak amplifier stage comprises a plurality of peak transistors spaced apart in the second direction, wherein the main stage input comprises the gate terminals of the respective main transistors and the main stage output comprises the drain terminals of the respective main transistors and the peak stage input comprises the gate terminals of the respective peak transistors and the peak stage output comprises the drain terminals of the respective peak transistors.

3. The circuit of claim 1, wherein the amplifier circuit has an input side and an opposing output side that are displaced in the second direction, wherein the input end of the peak input conductor and the input end of the main input conductor are both closer to the input side than the output side and the output end of the output conductor is closer to the output side than the input side.

4. The circuit of claim 1, wherein the main stage input and output are on opposing edges of the main amplifier stage and extend in the second direction and wherein the peak stage input and output are on opposing edges of the peak amplifier stage and extend in the second direction.

5. The circuit of claim 1, wherein the connections within the main input, main output, peak input and peak output sets of connections are spaced apart in the second direction.

6. The circuit of claim 1, wherein the main output set of connections are configured to provide a 90 degree phase shift to signals at an operational frequency of the amplifier.

7. The circuit of claim 1, further comprising one or more input capacitive elements configured to couple the main stage input to the main input conductor and/or the peak stage input to the peak input conductor.

8. The circuit of claim 1, further comprising at least one additional capacitive element configured to provide capacitive coupling to the main and/or peak amplifier stage.

9. The circuit of claim 8, further comprising an additional terminal, wherein an additional bond wire couples the least one additional capacitive element to the additional terminal.

10. The circuit of claim 1, wherein the main amplifier stage comprises a plurality of main amplifier substages and/or the peak amplifier stage comprises a plurality of peak amplifier substages, wherein each substage is disposed on a separate transistor die.

11. The circuit of claim 10, wherein the first and second main amplifier substages is associated with a separate additional capacitor element and/or a separate input capacitive element.

12. The circuit of claim 10, wherein each peak amplifier substage is associated with a separate output capacitive element.

13. The circuit of claim 1, comprising an output capacitive element configured to be galvanically coupled between the output conductor and the output terminal.

14. The circuit of claim 1, wherein the output terminal is provided on an opposing side of the circuit to the main and peak input terminals.

* * * * *